United States Patent
Mise et al.

(10) Patent No.: US 6,656,752 B1
(45) Date of Patent: Dec. 2, 2003

(54) ION CURRENT DENSITY MEASURING METHOD AND INSTRUMENT, AND SEMICONDUCTOR DEVICE MANUFACTURING METHOD

(75) Inventors: Nobuyuki Mise, Tsuchiura (JP); Tatehito Usui, Tsuchiura (JP); Masato Ikegawa, Tsuchiura (JP); Kazuo Nojiri, Oume (JP); Kazuyuki Tsunokuni, Kodaira (JP); Tetsuo Ono, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/890,611
(22) PCT Filed: Mar. 17, 1999
(86) PCT No.: PCT/JP99/01319
§ 371 (c)(1), (2), (4) Date: Oct. 11, 2001
(87) PCT Pub. No.: WO00/55900
PCT Pub. Date: Sep. 21, 2000

(51) Int. Cl.[7] .............................................. H01L 21/66
(52) U.S. Cl. ...................................................... 438/14
(58) Field of Search .............................. 438/14; 257/396

(56) References Cited

U.S. PATENT DOCUMENTS 5,840,199 A * 11/1998 Warren ........................... 216/2
5,850,042 A * 12/1998 Warren ...................... 73/514.36
5,969,393 A * 10/1999 Noguchi ....................... 257/396
6,127,255 A * 10/2000 Sugiura ........................ 438/624

* cited by examiner

*Primary Examiner*—John F. Niebling
*Assistant Examiner*—Andre C Stevenson
(74) *Attorney, Agent, or Firm*—Antonelli, Terry, Stout & Kraus, LLP (57) ABSTRACT

A wafer is exposed to a plasma. Here, the wafer includes a semiconductor or a conductor 1 provided on an insulator 6, an insulator 2 formed thereon and having a region the thickness of which has been made locally thin, and a 2nd conductor 4 provided on the insulator 2, one of the semiconductor or the conductor 1 and the 2nd conductor 4 having a 1st region from the surface of which a substantially total solid angle is formed, the other having a 2nd region a solid angle formed from the surface of which is made smaller than the 1st region. Then, a voltage is applied to the semiconductor or the conductor 1 and the 2nd conductor 4 so as to measure a time elapsing until the insulator 2 undergoes a dielectric breakdown. Moreover, the ion current density is determined from an electric charge required therefor and an area exposed onto the surface of the 2nd conductor 4.

Consequently, it becomes possible to measure, on the wafer, the current density of the ions launched into the wafer, thereby allowing the measuring method of the icon current density to be made suitable for the mass production.

5 Claims, 4 Drawing Sheets

FIG.1

VERY THIN REGION

VERY THIN REGION

FIG.8

ION CURRENT DENSITY MEASURING METHOD AND INSTRUMENT, AND SEMICONDUCTOR DEVICE MANUFACTURING METHOD

TECHNICAL FIELD

The present invention is suitable for an ion current density measuring method and the measuring instrument, and a semiconductor device manufacturing method. Here, the method and the instrument are the ones for measuring the current density of ions launched into a wafer and its distribution, which are one of the plasma characteristics in the plasma processing for an etching, a CVD, or the like.

BACKGROUND ART

In the manufacturing of a semiconductor device, and in a plasma-utilizing wafer processing apparatus in particular, the current density of the ions launched into the wafer and its distribution are important factors for determining the properties of the processing, e.g., the rate and the uniformity of the etching or the deposition, and damages of the components.

As a method of measuring the current density of the ions, there has been known a technology referred to as a probe method. This method has been described in, e.g., Shinriki Teii, "Basic Plasma Engineering", 1st ed. (published on May 30, 1986), Chap. 3. In the probe method, a probe is inserted into a region where the ion current density is to be measured, and positively charged ions are led selectively into a measuring unit by an electric voltage applied to the probe, thereby measuring the ion current density.

Also, concerning a technology of making a contrivance to the wafer so as to measure the ion current, JP-A-8-213374 can be cited, for example.

Although the above-described technology has an advantage of making it possible to measure the ion current density at an arbitrary position within the plasma, the ion current density measurement by the insertion of the probe was a difficult task. This is mainly because, in a plasma processing apparatus used for the mass production of the semiconductor devices, there exists a fear that the probe insertion causes metal contamination or foreign substances to be produced, or, it is required to provide a mass-producing apparatus with a port for the electrical wiring.

In the technology disclosed in JP-A-8-213374, in principle, the above-described probe is built and incorporated in the wafer. This condition requires that the electrical wiring for the voltage control or the signal fetching be set from the wafer to the outside of the plasma processing apparatus. Accordingly, the technology cannot be said to be appropriate for the mass-producing apparatus.

The object of the present invention is to measure the current density of the ions launched into the wafer without installing the electrical wiring through the plasma processing apparatus or without making the special contrivance to the wafer or a wafer-supporting member, thereby providing the ion current density measuring method and the measuring instrument and the semiconductor device manufacturing method which are suitable for the mass production.

DISCLOSURE OF INVENTION

In order to accomplish the above-described objects, in the present invention, there is provided the wafer including a semiconductor or a conductor provided on an insulator, an insulator formed on the semiconductor or the conductor and having a region the thickness of which has been made locally thin, and a 2nd conductor provided on the insulator, one of the semiconductor or the conductor and the 2nd conductor having a 1st region from the surface of which a substantially entire solid angle is formed, the other having a 2nd region a solid angle formed from the surface of which is made smaller than the 1st region, wherein the wafer is exposed to the plasma, and a voltage is applied to the semiconductor or the conductor and the 2nd conductor so as to measure a time that will elapse until the insulator undergoes a dielectric breakdown, then determining the ion current density from a charge and an area exposed onto the surface of the 2nd conductor, the charge being needed to cause the insulator to undergo the dielectric breakdown in correspondence with the voltage.

On account of this, one of the semiconductor or the conductor and the 2nd conductor has the 1st region from the surface of which the substantially total solid angle is formed, and the other has the 2nd region the solid angle formed from the surface of which is made smaller than the 1st region. As a result, electrons and the ions reach the 1st region by the same flux on average. Meanwhile, in the 2nd region, the flux of the high kinetic-energy ions exhibits an isotropic behavior, thus becoming larger than the flux of the low kinetic-energy electrons. This makes the electric potential of the 2nd conductor positive with reference to that of the semiconductor or the conductor, causing an electric current to flow through the region in the insulator the thickness of which has been made locally thin. In addition, the wafer is exposed to the plasma, and the voltage is applied to the semiconductor or the conductor and the 2nd conductor so as to measure the time that will elapse until the insulator undergoes the dielectric breakdown. This, further, allows the ion current density of the plasma to be determined from the charge needed to cause the insulator to undergo the dielectric breakdown and the area exposed onto the surface of the 2nd conductor. Consequently, it becomes possible to measure, on the wafer, the current density of the ions launched into the wafer without giving the special contrivance to the wafer or the wafer-supporting member, thereby allowing the measuring method of the ion current density to be made suitable for the mass production.

Also, in the present invention, there is provided the wafer including a semiconductor or a conductor provided on an insulator, an insulator formed on the semiconductor or the conductor and having a region the thickness of which has been made locally thin, and a 2nd conductor provided on the insulator, one of the semiconductor or the conductor and the 2nd conductor having a 1st region from the surface of which a substantially total solid angle is formed, the other of the semiconductor or the conductor and the 2nd conductor having a 2nd region a solid angle formed from the surface of which is made smaller than the 1st region, wherein, after the wafer has been exposed to the plasma for a fixed time, a voltage is applied to the semiconductor or the conductor and the 2nd conductor in a state of being not exposed to the plasma, thereby determining a charge that causes the insulator to undergo a dielectric breakdown, and then determining the ion current density from the charge and an area exposed onto the surface of the 2nd conductor, the charge being needed to cause the insulator to undergo the dielectric breakdown in correspondence with the voltage.

Moreover, in the present invention, there is provided the wafer including a semiconductor or a conductor provided on an insulator, an insulator formed on the semiconductor or the conductor and having a region the thickness of which has been made locally thin, and a 2nd conductor provided on the insulator, one of the semiconductor or the conductor and the 2nd conductor having a 1st region from the surface of which a substantially total solid angle is formed, the other of the semiconductor or the conductor and the 2nd conductor having a 2nd region a solid angle formed from the surface of which is made smaller than the 1st region, wherein, after the wafer has been exposed to the plasma for a fixed time, the capacitance-to-voltage characteristic of the semiconductor or the conductor and the 2nd conductor is measured, and an electric current flowing through the region that has been made locally thin is calculated from the capacitance-to-voltage characteristic that was measured before the wafer has been exposed to the plasma, then determining the ion current density from an area exposed onto the surface of the 2nd conductor.

In addition, in the present invention, there is provided an ion current density measuring instrument for setting a wafer at a predetermined position in a plasma processing apparatus so as to measure the ion current density at the time when the wafer is exposed to the plasma, the instrument having the wafer including a semiconductor or a conductor provided on an insulator, an insulator formed on the semiconductor or the conductor and having a region the thickness of which has been made locally thin, and a 2nd conductor provided on the insulator, one of the semiconductor or the conductor and the 2nd conductor having a 1st region from the surface of which a substantially total solid angle is formed, the other having a 2nd region a solid angle formed from the surface of which is made smaller than the 1st region, wherein an electric current flowing through the region in the insulator the thickness of which has been made locally thin is measured, thereby determining the ion current density.

Furthermore, in the present invention, an ion current density distribution in the plasma processing apparatus is measured so as to ascertain whether or not the distribution measured is in compliance with an ion current density distribution that becomes a criterion, then manufacturing the semiconductor devices.

On account of this, when manufacturing the semiconductor devices, the ion current density distribution is measured so as to ascertain whether or not the distribution measured is in compliance with the ion current density distribution that becomes the criterion. Accordingly, in the mass production of the semiconductor devices, there exists no necessity for destroying the mass-produced products to check them.

Still further, in the present invention, there is provided a wafer including a semiconductor or a conductor, an insulator formed on the semiconductor or the conductor and having a region the thickness of which has been made locally thin, and a 2nd conductor provided on the insulator, one of the semiconductor or the conductor and the 2nd conductor having a 2nd region a solid angle formed from the surface of which is made smaller than another region, wherein the wafer is exposed to a plasma, thereby measuring the ion current density of the plasma so as to manufacture the semiconductor devices.

Even further, in the present invention, there are formed on a wafer a 1st region into which ions and electrons are launched and a 2nd region into which the ions are launched but the electrons are not, wherein the wafer is exposed to a plasma, then measuring the ion current density of the plasma taking advantage of the 1st region and the 2nd region, thereby manufacturing the semiconductor devices.

BEST MODE FOR CARRYING OUT THE INVENTION

Hereinafter, referring to the drawings, the explanation will be given concerning the embodiments of the present invention.

Figure 1:
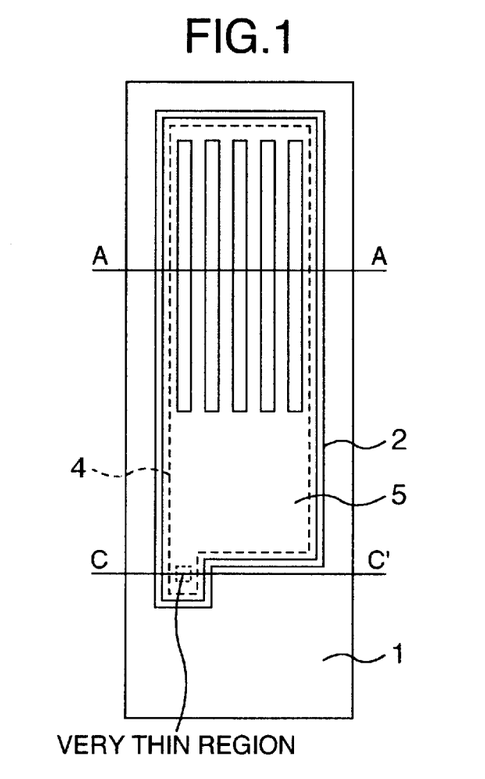
FIG. 1 is a top view for illustrating an ion current density measuring instrument according to an embodiment of the present invention.
Figure 2:
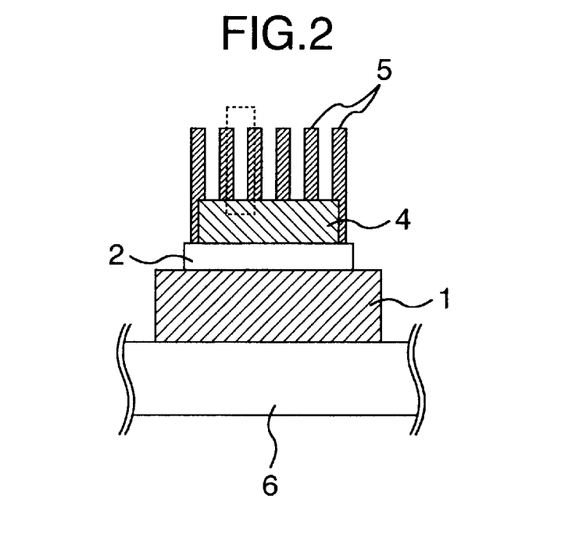
FIG. 2 is an A—A cross-sectional view of FIG. 1.
Figure 3:
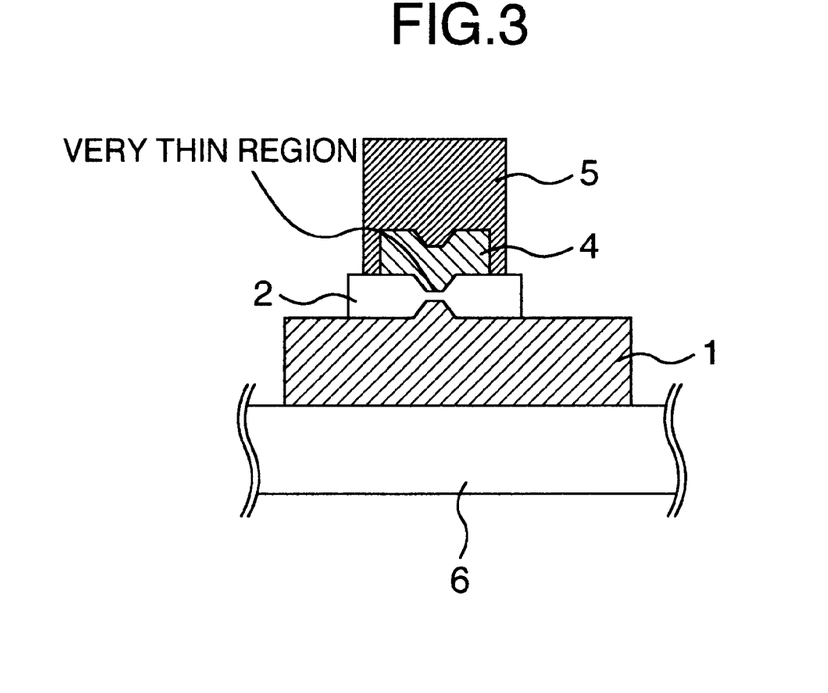
Figure 4:
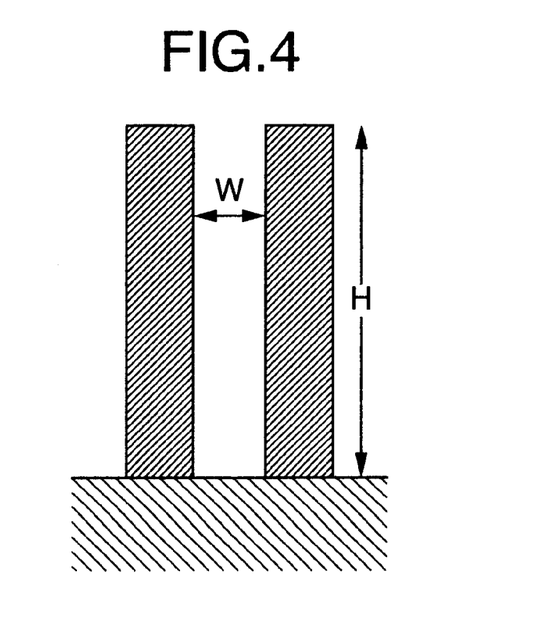
FIG. 4 is an enlarged cross-sectional view of a dashed line portion in FIG. 2.

FIG. 1 illustrates an ion current density measuring instrument formed on a wafer. In the drawings, a silicon 1 is provided as a semiconductor or a conductor provided on an insulator 6. A silicon oxide film 2 is formed thereon as an insulator having a region the thickness of which is several nm or less locally. In a region on the silicon 1 which is in contact with the region in the silicon oxide film 2 the thickness of which is thin, the impurity-concentration is maintained at a low value. Meanwhile, in the other region on the silicon, the impurity-concentration is made higher by impurity implantation or the like, thereby making the resistance ratio smaller. It is also allowable that the region on the silicon 1 which is in contact with the thin region in the silicon oxide film 2 is formed with a low impurity-concentration semiconductor, and the other region is formed with a different conductor material.

A conductor film 4 is formed on the silicon oxide film 2 as a 2nd conductor. It is preferable to employ, as the conductor film 4, a high conductivity metal such as aluminum or copper, a polysilicon film doped with an impurity in a high concentration, or the like.

The structure in which, in this way, the conductor such as a metal, the silicon oxide film, and the silicon are multilayered from the top is referred to as "MOS (Metal Oxide Silicon) capacitor". On the conductor film 4, insulators 5 having a W-wide and H-high substantially rectangle-shaped cross-section are formed with a constant spacing therebetween. An edge portion and a side wall of the conductor film 4 are covered with the insulators 5. A region on the conductor film 4 exposed onto the surface is limited only to W-wide regions that are sandwiched between the insulators 5. On account of this, a solid angle formed from the surface of this 2nd region is made smaller than a 1st region from the surface of which a substantially total solid angle is formed, the 2nd conductor 4 provided on the insulator 2 having the 2nd region, one of the semiconductor or the conductor 1 and the 2nd conductor 4 having the 1st region.

It is preferable to form the insulators 5 so that the following conditions are satisfied: Using a photoresist, a silicon oxide film, a silicon nitride film, or the like, the configuration of the 2nd region becomes a rectangle-shaped configuration. Simultaneously, the length of the shorter side falls in the range of ⅒th to ½th of the height so that $H/W \geq 2$ can be maintained.

In general, the structure in which the insulators 5 are provided on an upper electrode of the MOS capacitor is referred to as "shade structure-attached MOS capacitor". The silicon 1 that has a structure like this on its upper portion is located on the insulator 6 such as a silicon oxide film. In order to form on the insulator 6 the structure as described above, it is desirable to employ, for example, a SOI wafer.

The shade structure-attached MOS capacitor is formed as follows: Before, halfway under, or after the formation of the above-described structure, a silicon situated on one side of the SOI wafer is etched in an island-like configuration. Then, a semiconductor region that has remained after the etching is cut off electrically from the surrounding semiconductor region.

Next, the wafer equipped with the shade structure-attached MOS capacitor is set at a predetermined position in a plasma processing apparatus, then being exposed to the plasma.

In plasma etching or plasma-enhanced chemical vapour deposition used for a semiconductor device manufacturing a bias voltage for leading the positively charged ions into the wafer is often applied to the wafer. This condition increases wafer-perpendicular velocity components of the positively charged ions, causing the ions of the wafer-perpendicular velocity components to be launched into the wafer with a tremendously large velocity distribution function. On the other hand, since the mass of the electrons is small, the electrons are not influenced so much by the bias voltage, thus travelling in an isotropic manner.

When the wafer equipped with the shade structure-attached MOS capacitor is exposed to the above-described plasma, at a position from which the plasma forms a substantially total solid angle, such as the region on the silicon 1 exposed onto the surface or the upper surfaces of the insulators 5, the electrons and the ions reach the region or the surfaces by the same flux on average. However, from the conductor film 4 that is exposed onto the surface in a state of being surrounded by the insulators 5, the plasma forms only a smaller solid angle. As a result, the electrons and the ions have a high probability of travelling perpendicularly to the silicon 1. Accordingly, the flux of the high kinetic-energy ions exhibits an isotropic behavior, thus becoming larger than the flux of the low kinetic-energy electrons. Consequently, the conductor 4 turns out to have a positive electric potential Vg with reference to the silicon 1.

The existence of the electric potential difference between the conductor 4 and the silicon 1 causes an electric current to flow through the region in the silicon oxide film 2 the thickness of which is thin. This is referred to as the current-voltage characteristic. Table 1 shows the characteristic (the measurement values) in the case where the thin silicon oxide film is 4.5 nm thick and 30 $\mu m^2$ in area. This area is the mask's area of a silicon nitride film used for forming the thin silicon oxide film by heat oxidation.

TABLE 1

| current-voltage characteristic of silicon oxide film | |
|---|---|
| Vg: voltage applied to silicon oxide film (V) through silicon oxide film | Ig: current flowing |
| 0 | $1 \times 10^{-12}$ |
| 4.0 | $1 \times 10^{-12}$ |
| 4.5 | $5 \times 10^{-12}$ |
| 5.0 | $1 \times 10^{-10}$ |
| 5.4 | $1 \times 10^{-9}$ |
| 5.8 | $1 \times 10^{-8}$ |

TABLE 1-continued

| current-voltage characteristic of silicon oxide film | |
|---|---|
| Vg: voltage applied to silicon oxide film (V) through silicon oxide film | Ig: current flowing |
| 6.2 | $1 \times 10^{-7}$ |
| 6.7 | $1 \times 10^{-6}$ |
| 7.0 | $3 \times 10^{-6}$ |

As is shown in Table 1, in general, the current-voltage characteristic of the thin silicon oxide film is as follows: When the applied voltage V is equal to about 5 V or lower, only an infinitesimal electric current flows. If, however, a voltage higher than that is applied, the current that will flow is gradually increased with the increase of the applied voltage. When a voltage higher than about 7 V is applied, the flowing current is increased steeply.

In the state of being exposed to the plasma, the conductor 4 has the positive electric potential Vg with reference to the silicon 1. At this time, the current-voltage characteristic of the silicon oxide film 2 allows the current Ig corresponding to Vg to flow.

Assuming that the current density f of the ions that will reach the silicon 1 is 1 mA/cm$^2$, and the conductor's area exposed onto the surface is S, and if Vg is, e.g., 5. 8 V, the current Ig becomes equal to $1 \times 10^{-8}$ A. This current Ig is equal to a difference between the positive charges, i.e., the ions, and the negative charges, i.e., the electrons, both the ions and the electrons reaching, in the unit time, the conductor portion exposed onto the surface.

At this time, even if the flux of the ions directed to bottoms of the grooves is considered to be equal to the flux of the ions directed to the flat portions on the upper portions of the grooves, and even if the electrons are considered not to reach the bottoms of the grooves, namely, even if the substantial flux of the ions directed to the groove bottoms is considered as its maximum value, the area S needed to obtain Ig is given by $$S = Ig / f \qquad (1)$$

The substitution of Ig=$1 \times 10^{-8}$ A and f=1 mA/cm$^2$ gives S=$1 \times 10^{-5}$ cm$^2$ =1000 $\mu m^2$. When representing, by Sg (=30 $\mu^2$), the area of the above-described region in the silicon oxide film 2 the thickness of which is thin, this value of S is about 30 times as large as Sg.

When the conductor's area S that is exposed onto the surface is equal to $3 \times 10^{-3}$ cm$^2$, which is about 10000 times as large as the thin region's area Sg in the silicon oxide film 2, Ig is equal to $3 \times 10^{-6}$ A and even this time, Vg is equal to only 7 V. Consequently, as long as S/Sg is about 10000 or less, Vg becomes equal to an order of only 7 V.

At the time when Vg becomes equal to at most the order of only 7 V, the behavior of the ions and the electrons becomes as follows:

The applied bias voltage of tens of volts or more accelerates the ions. On account of this, the voltage of at most 7 V exerts no influence upon the behavior of the ions. Namely, the velocity components of the ions perpendicular to the silicon 1 have been tremendously large from the beginning, and thus the ions reach the conductor film with their orbits hardly bent by Vg. Also, the upper portions of the grooves' side walls have become negatively charged with reference to the silicon 1 on account of the electrons that had already reached there. This condition makes it rather difficult for the electrons to reach the insides of the grooves. Accordingly, it is possible to neglect the effect of being led into the groove bottoms the potential of which becomes at most the order of only 7 V.

As the aspect ratio of the groove defined by the height-to-width (H/W) of the groove becomes larger, the condition of making it unlikely for the electrons to reach the groove bottom becomes more influential and noticeable. If all the planes constituting the groove are electrically neutral, the ratio at which the isotropically moving electrons will reach the groove bottom can be determined by considering a solid angle formed from the groove bottom toward the outside of the groove.

The larger the aspect ratio becomes, the smaller this solid angle becomes. In particular, if the aspect ratio is 2 or more, the flux of the electrons that will reach the groove bottom is 20% or less of the flux of the electrons that will reach a flat portion of the groove's upper portion. In order to decrease the flux of the electrons reaching the groove bottom, it is advisable to increase the aspect ratio of the groove, and what is more desirable is to make the aspect ratio 4 or more. If the aspect ratio is made equal to 4 or more, the flux of the electrons reaching the groove bottom becomes equal to 10% or less of the flux of the electrons reaching the flat portion of the groove's upper portion. However, making the aspect ratio larger than this does not decrease the flux of the electrons very much, and also makes it rather difficult to form the groove structure. Also, if the upper portion of the groove's side wall becomes negatively charged, the flux of the electrons reaching the groove bottom is decreased even further. On the other hand, the ions do not depend on the aspect ratio of the groove very much.

As explained above, when the aspect ratio is equal to 2 or more, the electrons hardly reach the conductor on the groove bottom and conversely, almost all of the ions reach the conductor thereon. At this time, the total quantity of the electric charges that will reach, in 1 second, the conductor film 4 exposed onto the surface becomes equal to the electric current Ig that flows through the thin silicon oxide film 2, which is given by $$Ig = f \times S \quad (2)$$

Moreover, as a characteristic of the thin silicon oxide film 2, there exists an electric charge Q that flows through the thin silicon oxide film 2 and that is needed to cause the dielectric breakdown to occur. If an electric charge more than Q flows through the thin silicon oxide film 2, the thin silicon oxide film exhibits a current-voltage characteristic that differs from the current-voltage characteristic prior thereto. This state is regarded as a state where the thin silicon oxide film 2 has undergone the breakdown. This current-voltage characteristic is the relationship between the current flowing between the silicon 1 and the conductor 4 and the voltage applied therebetween.

It is assumed that the thin silicon oxide film 2 has undergone the breakdown after it has been exposed to the plasma during a time T. The expression of this process is given by the following equation:

$$Q = Ig \times T \quad (3)$$

Using the equation (2) and the equation (3), this equation can be modified into $$f = Q/S/T \quad (4)$$

All the variables at the right side of this equation can be checked and determined, and thus the ion current density f is measured using these values.

If the following relationship or the like exists between an accurate ion current density f' that has been determined under a certain condition by another method and the ion current density f that has been calculated using the present invention, it is also allowable to determine a more accurate ion current density f by converting f using the equation (4'):

$$f' = a \times f + b \quad (4')$$

Q can be calculated as follows: A shade structure-attached MOS capacitor that is the same as the one to be exposed to the plasma is prepared. Next, the voltage is applied to its thin silicon oxide film 2, then measuring an electric current that will flow through the thin silicon oxide film 2 at that time. Moreover, Q is calculated from the electric current and the time T elapsing from the voltage application to the gate breakdown. S, which is the area of the conductor 4 exposed onto the surface, can be determined in advance from the design value, a SEM photograph, or the like. T can be measured, since T is the time elapsing until the thin silicon oxide film 2 has undergone the breakdown by the exposure of the shade structure-attached MOS capacitor to the plasma.

Figure 5:
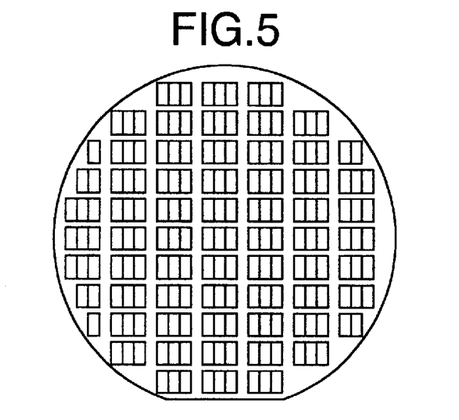
FIG. 5 is a plan view for illustrating the manner in which the ion current density measuring instruments according, to another embodiment of the present invention are located on a wafer.

By locating, on a wafer and in plural number, the above-described ion current density measuring instruments having different Q or S, it becomes possible to determine f and its distribution at a fewer number of measurement times. Referring to FIG. 5, the example will be explained below. In this example, the ion current density measuring instruments having three types of different S (i.e., S1, S2, S3) are located on a piece of wafer. The three ion current density measuring instruments are located on the one silicon 1.

The plurality of instruments having the already-explained structure and the different S have been prepared on the one piece of wafer. This condition allows a critical value Scr to be measured at a single time, thus making it possible to measure the ion current density f or its distribution on the wafer. Here, the critical value Scr is a value on which the gate of S less than the critical value Scr will not be broken down but the gate of S larger than that will be broken down.

The plurality of instruments having different Q instead of the different S are prepared in the wafer, which also makes it possible to execute the similar measurements. It is possible to configure the thin silicon oxide films having the different Q by forming the thin silicon oxide films having different thickness or areas Sg or by changing the forming condition of the thin silicon oxide films. For the purpose of this, it is advisable to modify the time, the temperature, or the mask pattern for forming the thin silicon oxide films.

Furthermore, it is also allowable to measure the ion current density f or its distribution on the wafer by, although the number of measurement times is increased, changing the time during which the ion current density measuring instrument will be exposed to the plasma. Namely, the measurements similar to the above-described ones are executed in plural number, and then the measurement values are subjected to a statistical processing, thereby determining Q, T, and f. This makes it possible to enhance the reliability of the measurements.

Concerning a thin silicon oxide film that has not been broken down even if it has been exposed to the plasma during the certain fixed time T, the ion current density f can be measured as follows: The voltage is applied to the thin silicon oxide film 2 in a state of being not exposed to the plasma, then measuring an electric current that will flow through the thin silicon oxide film 2 at that time. Next, the thin silicon oxide film is broken down, then calculating an electric charge Q' that has flown through the thin silicon oxide film 2 and that is needed for the gate breakdown in the state of being not exposed to the plasma. Finally, using Q', the ion current density f can be measured by $$f=(Q-Q')/S/T \quad (5)$$

For this equation to be held, the electric potential of the silicon 1 must be in a state of being influenced by only the plasma in close proximity thereto. Even when the plasma is not uniform, the electric potential of the silicon 1 is implemented so that it must not be influenced by the plasma positioned at a far distance.

Assuming that the electric potential of the silicon 1 has been influenced by the plasma positioned at the far distance, there exists a possibility that, even if no shade structure exists, a difference in the electric potential occurs between the conductor 4 on the upper portion of the MOS capacitor and the silicon 1. Then, the existence of the electric potential difference between the conductor 4 and the silicon 1 causes an electric current corresponding to the electric potential difference to flow through the thin silicon oxide film 2. As a result, it turns out that the electric current flowing through the thin silicon oxide film 2 is not determined by a difference between the current densities flowing into the silicon 1 and the conductor 4 that sandwich the thin silicon oxide film.

Thus, it is advisable to restrict the silicon 1 and the conductor 4 to a range where the state of the plasma can be regarded as substantially unchanged from the locally thin region in the silicon oxide film 2.

In addition, the insulator 6 such as a silicon oxide film is located in the surroundings of the silicon 1 exposed onto the surface, thereby electrically isolating the silicon 1 from the other regions. As a consequence, even when the plasma is not uniform, the electric potential of the silicon 1 is determined by the influence of the plasma in close proximity thereto.

For electrically isolating the silicon 1 of the shade structure-attached MOS capacitor, the following methods are preferable in addition to the method using the SOI wafer: A method of pasting the shade structure-attached MOS capacitor onto an insulator, a method of etching the silicon 1 after pasting onto an insulator the shade structure-attached MOS capacitor where the silicon 1 is not electrically isolated, or the like.

Figure 7:
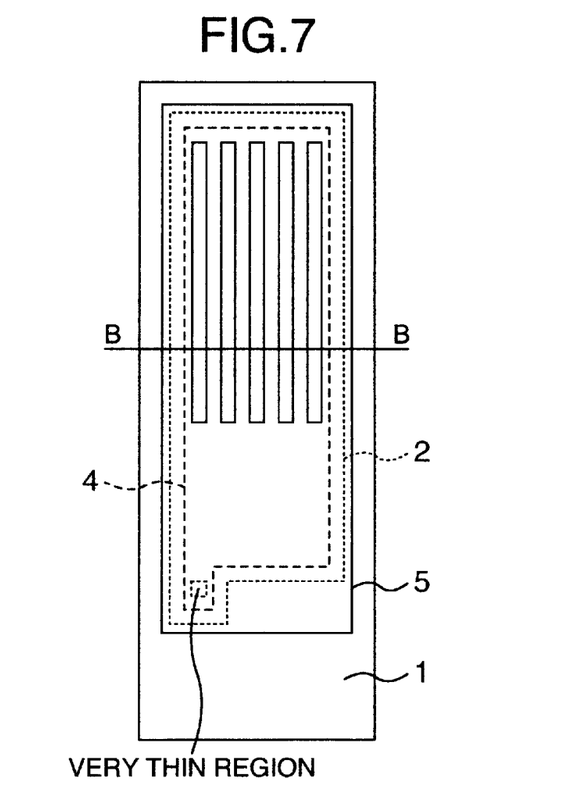
FIG. 7 is a top view for illustrating an ion current density measuring instrument according to still another embodiment of the present invention.
Figure 8:
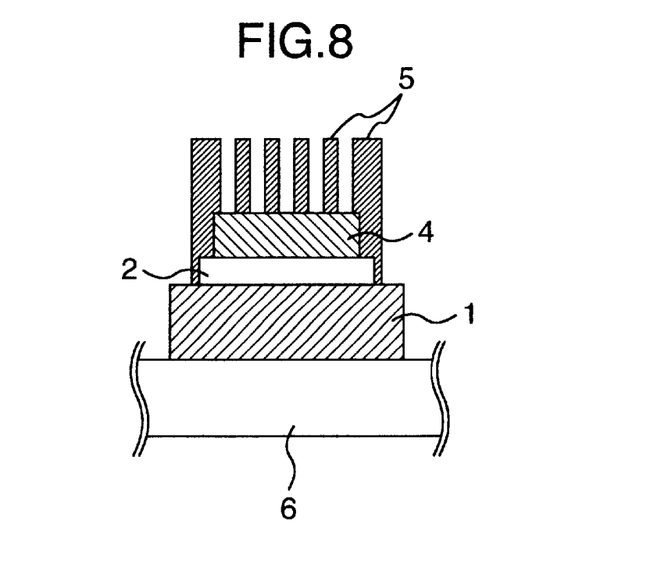
FIG. 8 is a B—B cross-sectional view of FIG. 7.

Next, referring to FIG. 7 and FIG. 8, the explanation will be given below concerning another embodiment. What differs from the embodiment illustrated in FIG. 1 is that a silicon nitride film 3 is sandwiched between the silicon oxide film 2, which has the region in which the thickness of the film has been made locally thin, and the conductor film 4.

The structure like this is referred to as "MNOS (Metal Nitride Oxiside Silicon) capacitor". When the voltage Vg is applied to the MNOS capacitor, electrons or positive holes are injected into the capacitor from the silicon 1 in correspondence with the voltage, and as a consequence, a flat band voltage Vfb is shifted. Also, in the MNOS capacitor as well, the current-voltage characteristic exists which is quite similar to that in the MOS capacitor, and thus the electric current Ig flows in correspondence with the applied voltage Vg.

The shade structure as explained in FIG. 1 is provided on the conductor 4 of the MNOS capacitor, thereby forming a shade structure-attached MNOS capacitor. The exposure of this shade structure-attached MNOS capacitor to the plasma causes the conductor 4 to have the positive electric potential Vg with reference to the silicon 1, and thus the MNOS capacitor traps the electrons in response to the positive electric potential Vg. Measuring the shift quantity (Vfb) of the flat band voltage results in a positive value. Investigating the relationship between Vfb and Vg in advance makes it possible to determine, from Vfb that has been measured after the exposure to the plasma, the electric voltage Vg that was being applied to the thin silicon oxide film 2 during the exposure to the plasma. Also, the MNOS capacitor's current-voltage characteristic investigated in advance makes it possible to determine the electric current Ig that will flow when the electric voltage Vg is applied. As described previously, Ig is equal to the product of the current density f of the ions and the conductor's area S exposed onto the surface. Thus, f is given by $$f=Ig/S \quad (6)$$

and the ion current density f can be determined from Ig and S. In order to investigate a variation in the flat band voltage, the capacitance-voltage characteristic is measured before and after the exposure to the plasma. Here, the capacitance refers to a capacitance of the thin silicon oxide film, and the voltage refers to a direct voltage applied to the thin silicon oxide film.

A direct voltage Vd of an order of −10 V to +10 V is applied to the silicon oxide film 2 and the silicon nitride film 3 and in addition, a high-frequency voltage of an order of 1 MHz is further applied thereto, thereby investigating the relationship between the capacitance C and the applied voltage Vd. Next, after applying a fixed direct voltage Vg during the same time T as the time of the exposure to the plasma, the relationship between the capacitance C and the applied voltage Vd is investigated by much the same method. At this time, before and after applying the fixed direct voltage Vg during the fixed time T, the shift quantity (Vfb) of the flat band voltage for obtaining a certain fixed C can be derived from a variation in Vd. Determining this Vfb as a function of T and Vg in advance makes it possible to recognize at about how much electric potential the conductor 4 has been caused to be with reference to the silicon 1 by the plasma. This is done by determining Vfb that has been generated after the exposure to the plasma during the fixed time T. Also, the current-voltage characteristic investigated in advance otherwise allows the voltage to be converted into an electric current, thereby making it possible to calculate the electric current I. Accordingly, using the conductor's area S exposed onto the surface, the ion current density f can be determined by the equation (6).

In general, in the above-described relationship between the applied voltage Vg and the shift quantity Vfb of the flat band voltage, there exists a region where, even if Vg is varied, Vfb is not varied. The region like this is referred to as "dead band". In the case where, e.g., when measuring the ion current density using the shade structure-attached MNOS capacitor, Vg wished to be utilized is included in the dead band of Vfb, a voltage is applied to the MNOS capacitor beforehand so as to shift the Vg-Vfb characteristic. This allows the shade structure-attached MNOS capacitor to be operated in a region other than the dead band of Vfb, thereby making it possible to measure the ion current density f.

Instead of using the shade structure-attached MOS capacitor or the shade structure-attached MNOS capacitor, the ion current density f can also be measured using a nonvolatile storage apparatus such as a shade structure-attached EEPROM. Taking an EEPROM as the example, a nonvolatile memory such as the EEPROM is formed on an insulator, and then the shade structure as illustrated in FIG. 1 is formed on its control gate electrode with an insulating material. Meanwhile, after forming a structure in which a portion of the substrate of the nonvolatile memory such as the EEPROM is exposed onto the surface, the structure is exposed to the plasma. This causes the electric potential difference Vg to occur between the control gate electrode toward which the reaching of the electrons is suppressed and the silicon toward which the reaching of the electrons is not suppressed. The EEPROM stores this electric potential difference as the shift quantity Vth of a threshold value voltage. It is possible to investigate the relationship between Vg and Vth in advance. Thus, after the process has been terminated, the measurement of Vth allows Vg to be calculated. Accordingly, the ion current density f can be calculated from the relationship between Vg and Ig flowing through the gate.

Although, in the above-described explanation, the shade structure is formed on the conductor on the thin silicon oxide film, the formation of the shade structure on the silicon 1 also makes it possible to perform the same measurements and calculations.

The ion current density measuring instrument explained so far can be configured using only the materials used for the semiconductor devices. This condition, unlike the general probe, results in no worry about the metal contamination. Also, since the electrical wiring need not be installed therethrough, it is possible to measure the ion current density without making the special contrivance to the plasma processing apparatus.

Unlike the ion current density measuring instrument the representative of which is based on the conventional probe method, the ion current density measuring instrument according to the present embodiment is easily applicable to the mass-producing apparatus. In the mass production of the semiconductor devices, the instrument is preferable for determining the timing of executing a wet cleaning processing where such an organic solvent as alcohol, pure water, or the like is used. Otherwise, the instrument is preferable for ascertaining whether or not the apparatus has been restored back to its original state when the apparatus is assembled after the wet cleaning.

Figure 6:
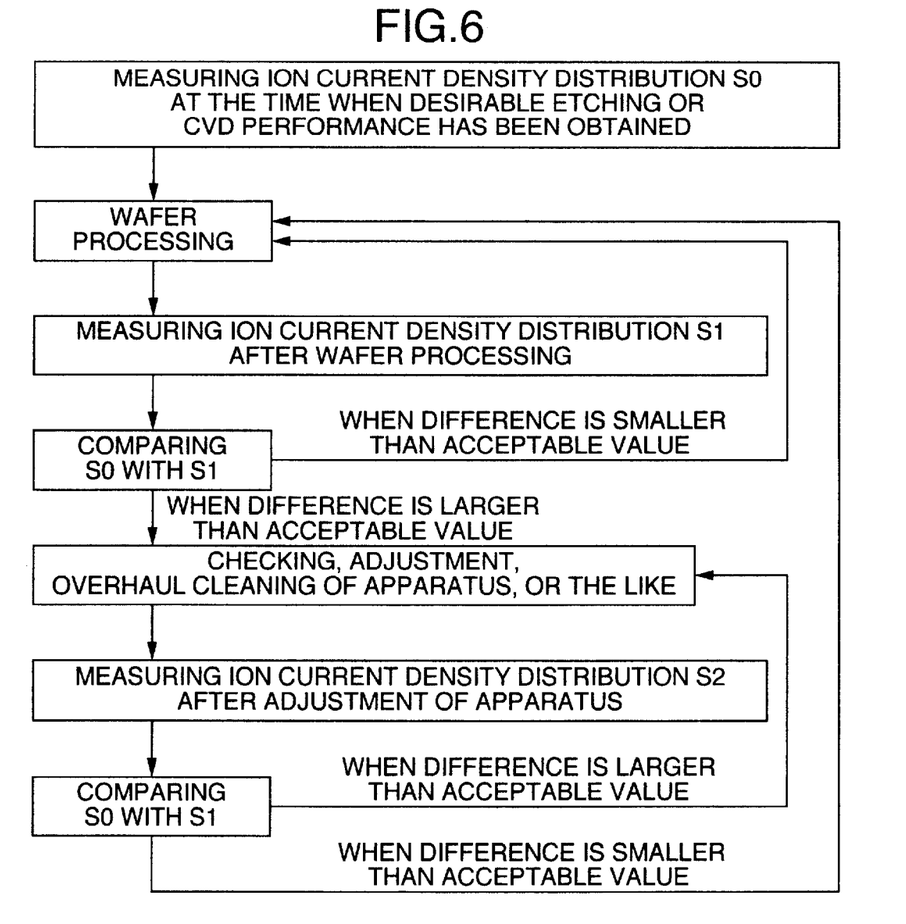
FIG. 6 is a flowchart diagram for showing an ion current density measuring method in an etching apparatus according to still another embodiment of the present invention.

Namely, as is indicated in FIG. 6, it is advisable to beforehand measure an ion current density distribution s 0 under a predetermined condition at the time when a desirable etching result can be obtained in an etching apparatus or a desirable CVD result can be obtained in a CVD apparatus.

Repeating the plasma processing in the etching apparatus or the CVD apparatus makes the following unavoidable: A film is deposited on the inner wall or the electrode of the etching apparatus or the CVD apparatus, the inner wall or the electrode is shaved, or the surface of the inner wall is deteriorated in quality.

The film that has been deposited on the inner wall exerts influences upon the etching or the CVD. The influences exerted upon the etching or the CVD, in many cases, result in the necessity for destroying the mass-produced products to check them.

Thus, using the ion current density measuring instrument according to the present embodiment under the above-described predetermined condition, the ion current density distribution is measured periodically while the mass-producing process is repeated several times.

Based on this, as compared with a result measured when the etching result or the CVD result was obtained and becoming a criterion, if the distribution coincides with the result within a fixed range and lies within a suitable region, the mass production is continued. If the distribution does not coincide therewith, the apparatus is checked, then executing the wet cleaning of the components where such an organic solvent as alcohol, pure water, or the like is used, replacements of the components, or the other adjustments. After that, the ion current density distribution is measured using the ion current density measuring instrument according to the present embodiment again. Then, after confirming that the result coincides with the criterion value within the fixed range, the mass production is restarted.

The above-described method allows the wet cleaning frequency to be suppressed down to the smallest possible degree. Moreover, the method makes it possible to suppress the occurrence of a defective product when the mass production is restarted with the apparatus after the wet cleaning, thereby allowing the operation ratio of the apparatus to be enhanced substantially.

The condition under which the ion current density is measured may differ from a condition employed in the actual mass production. Thus, the condition may be a pressure made higher by the adjustment of a valve than the pressure within the apparatus used for the mass production, or the ion current density may be measured using a gas differing from the one used in the actual mass production. Also, the employment of a gas that does not cause the etching or the film's deposition makes it possible to use the ion current density measuring instrument repeatedly.

Moreover, by estimating a cause of the yield decrease in the mass production, it is possible to eliminate the cause. For example, when the foreign substances are produced so frequently and the frequent production is attributed to an abnormal electric discharge at a certain position within the plasma processing chamber, the use of the ion current density measuring instrument as presented by the present embodiment allows the ion current density distribution to be measured on the wafer. By making a comparison between the ion current density distribution on the wafer in the state where the large number of foreign substances are produced and the ion current density distribution on the wafer in the normal state, it becomes possible to confirm the state of the apparatus. In addition, by focusing a special attention onto a proximity to a position where there exists a significant difference between the both so as to investigate the cause of bringing about the abnormal state, it becomes possible to restore the apparatus back to the normal state in a short while.

In the plasma apparatus used for manufacturing the semiconductors, there are many cases where, in order to accelerate the wafer processing, the bias voltage is applied so as to lead the ions into the wafer. In the state where the bias has been applied to the wafer, when trying to use the probe method so as to measure the ion current density reaching the wafer, the difficulty in the probe isolation results in the difficulty in the probe insertion. Accordingly, measuring the ion current density by the probe method is substantially difficult.

The use of the ion current density measuring instrument as presented by the present embodiment permits the ion current density to be measured in the state where the bias has been applied to the wafer. This makes it possible to use the instrument for the development of the plasma processing apparatus or the processing process as well.

When optimizing the bias voltage to be applied to the wafer in the plasma processing apparatus, conventionally, the judgement could not help being made in accordance with the rate of the etching or the CVD, the cross-section configuration at the time when the pattern-attached wafer has been processed, or the yield of the semiconductor devices. However, the investigation of the relationship between the voltage to be applied and the ion current density reaching the wafer makes it easy to optimize the bias voltage.

Also, the investigation of the ion current density distribution makes it possible to optimize the apparatus's configuration, e.g., to determine the distance from the wafer's edge to the inner wall of the processing chamber so that the ion current density distribution becomes a desirable one, or makes it possible to adjust the flow quantity, the pressure, or the like.

What is claimed is:

1. An ion current density measuring instrument for setting a wafer at a predetermined position in a plasma processing apparatus so as to measure an ion current density at the time when said wafer is exposed to a plasma, said ion current density measuring instrument comprising said wafer which includes:

a semiconductor or a conductor provided on an insulator, an insulator formed on said semiconductor or said conductor and having a region the thickness of which has been made locally thin, a 2nd conductor provided on said insulator, a 1st region which one of said semiconductor or said conductor or said 2nd conductor forms a substantially whole solid angle is formed, and a 2nd region which the other of said semiconductor or said conductor or said 2nd conductor forms a smaller solid angle than said 1st region, wherein said ion current density is determined by measuring an electric current flowing through said region in said insulator the thickness of which has been made locally thin.

2. The ion current density measuring instrument as claimed in claim 1, wherein a nitride film is provided between said insulator and said 2nd conductor.

3. The ion current density measuring instrument as claimed in claim 1, wherein there is provided said insulator formed so that configuration of said 2nd region becomes rectangle-shaped configuration and length of a shorter side thereof falls in a range of ¼th to ½th of height thereof.

4. The ion current density measuring instrument as claimed in claim 1, wherein said insulators or said 2nd conductors are located on said wafer, electric charges needed to cause said insulators to undergo dielectric breakdowns being different from each other, areas exposed onto the surfaces of said 2nd conductors being different from each other.

5. An ion current density measuring instrument comprising:

means for exposing a wafer to a plasma, said wafer including a semiconductor or a conductor, an insulator formed on said semiconductor or said conductor and having a region the thickness of which has been made locally thin, and a second conductor provided on said insulator, one of said semiconductor or said conductor and said second conductor having a second region a solid angle formed from the surface of which is made smaller than another region, and means for measuring an ion current density of said plasma.

* * * * *